United States Patent [19]

Komori

[11] 4,238,738

[45] Dec. 9, 1980

[54] TEMPERATURE-COMPENSATED AMPLIFIER CIRCUIT

[75] Inventor: Yuji Komori, Yokohama, Japan

[73] Assignee: Tokyo Shibaura Electric Co., Ltd., Kawasaki, Japan

[21] Appl. No.: 914,293

[22] Filed: Jun. 9, 1978

[30] Foreign Application Priority Data

Jun. 15, 1977 [JP] Japan .................................. 52-70616
Jun. 15, 1977 [JP] Japan .................................. 52-78307

[51] Int. Cl.$^2$ .......................... H03F 1/30; H03F 3/45
[52] U.S. Cl. .................................... 330/256; 330/257; 330/288; 330/289
[58] Field of Search ................. 330/69, 256, 257, 288, 330/289

[56] References Cited

U.S. PATENT DOCUMENTS

| | | | |
|---|---|---|---|
| 3,522,548 | 8/1970 | Heuner et al. | 330/256 |
| 3,629,691 | 12/1971 | Wheatley | 307/297 X |
| 3,740,658 | 6/1973 | Loving, Jr. | 330/256 |
| 3,980,963 | 9/1976 | Doi | 330/289 |

FOREIGN PATENT DOCUMENTS 4720438  7/1972  Japan ........................ 330/289

Primary Examiner—James B. Mullins
Attorney, Agent, or Firm—Cushman, Darby & Cushman

[57] ABSTRACT

A temperature-compensated amplifier circuit including an amplifier section having first and second transistors which are connected at their collectors to a power source terminal through first and second resistors, and having d.c. biased bases coupled to signal source terminals; a current source including a third transistor having a collector coupled with the emitters of the first and second transistors and a grounded emitter; a fourth transistor having an emitter coupled with the power source terminal through a third resistor; a fifth transistor connected at the emitter to the power source terminal and at the base to the base of the fourth transistor; a sixth transistor having both base and collector commonly coupled to the collector of the fourth transistor and grounded at the emitter; and a seventh transistor connected at the collector to the base and the collector of the fifth transistor, at the base to the bases of the third and sixth transistors and grounded at the emitter. The emitters of the sixth and seventh transistors are formed so as to have a predetermined area ratio thereby controlling the current in the forth and fifth transistors. The first to third resistors are formed to have substantially equal temperature characteristics.

25 Claims, 13 Drawing Figures

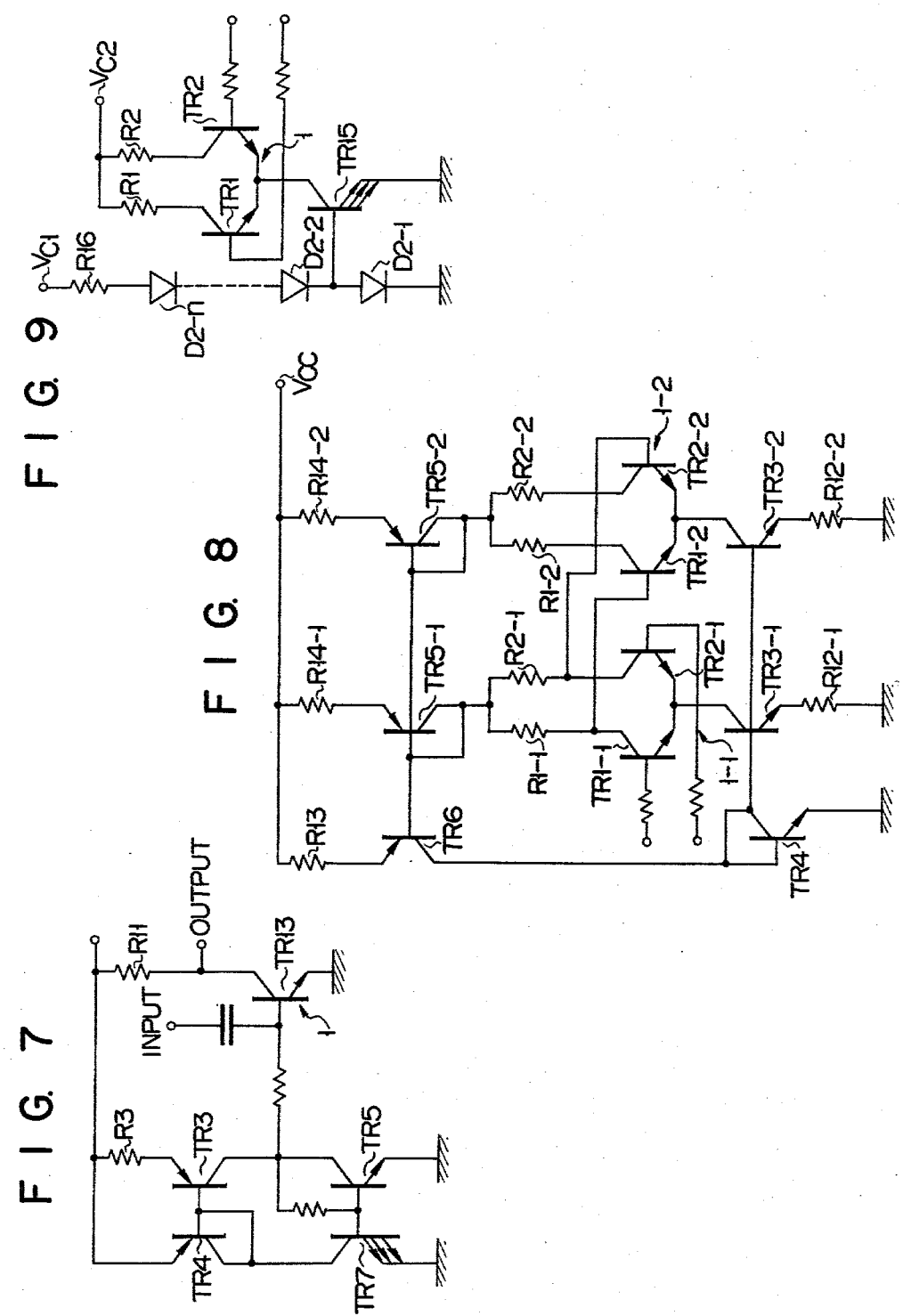

TEMPERATURE-COMPENSATED AMPLIFIER CIRCUIT

This invention relates to a temperature-compensated amplifier circuit with a minimum variation of its characteristic with respect to temperature change.

Various amplified circuits using components whose characteristics may easily change with temperature change such as diodes, transistors and resistors have been provided. Many attempts have been made to prevent the amplification factor of those amplifier circuits from varying with temperature change. However, most of them are unsuccessful in that the temperature compensating effect is insufficient with complex circuit construction.

Accordingly, an object of the invention is to provide a temperature-compensated amplifier circuit with a relatively simple circuit construction and a minimum variation of the amplification factor with respect to temperature change.

According to one aspect of the invention, there is provided a temperature-compensated amplifier circuit comprising: an amplifier section; load resistive means coupled with the amplifier section; temperature compensating resistive means having substantially the same temperature characteristics as the load resistive means; and a current source for feeding a first current to the temperature compensating resistive means and for feeding a drive current having a given ratio to the first current to the amplifier section.

Other objects and features of the invention will be apparent from the following description taken in connection with the accompanying drawings, in which:

FIG. 7 shows a circuit diagram of a temperature-compensated amplifier circuit of which the amplifier section is comprised of a single transistor;

FIG. 8 shows a circuit diagram of a temperature-compensated amplifier circuit having two amplifier sections connected in cascade fashion;

FIG. 9 shows a circuit diagram of a temperature-compensated amplifier circuit of which the current source is partly formed by series-connected diodes;

Figure 1:
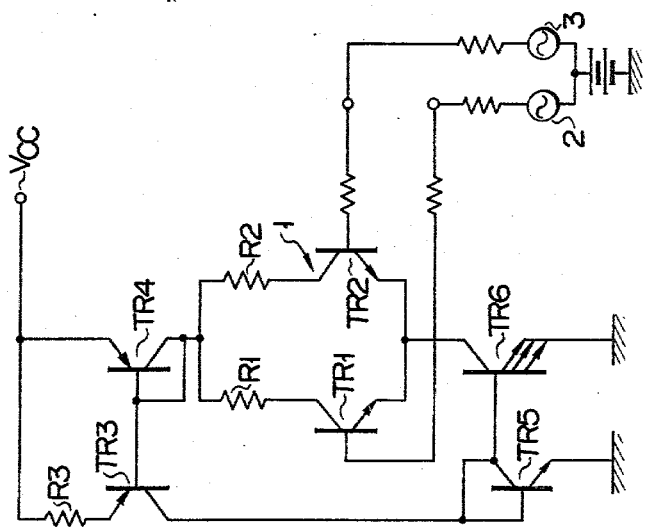
FIG. 1 shows a temperature-compensated amplifier circuit according to one embodiment of this invention in which the ratio of currents flowing into the current paths of two transistors constituting a part of a current source, is determined by the ratio of the emitter areas of two transistors.

Referring now to FIG. 1, there is shown an embodiment of a temperature-compensated amplifier circuit according to the invention. In FIG. 1, a differential amplifier section 1 includes a couple of transistors TR1 and TR2. These transistors TR1 and TR2 are connected at the emitters to each other. The transistor TR1 is connected at the base to a first signal source 2 which is d.c. biased and at the collector to one end of a load resistor R1. The transistor TR2 is connected at the base to a second signal source 3 which is d.c. biased and at the collector to one end of another load resistor R2. The load resistors R1 and R2 are equal to each other in temperature characteristic. The resistors R1 and R2 are commonly connected at the other ends.

In the temperature-compensated amplifier circuit shown in FIG. 1, a power source section includes third to sixth transistors TR3 to TR6. The emitter of the third transistor TR3 is coupled with a power source terminal Vcc, via a resistor R3. The transistor TR4 is connected at the emitter to the power source terminal Vcc, at the base to the base of the transistor TR3 and to the collector of the transistor TR4 per se and at the collector to the other end of the resistors R1 and R2. The transistor TR5 is connected at the base to the collector of the transistor TR3 and the collector of the transistor TR5 per se, and grounded at the emitter. A transistor TR6 of a multi-emitter type is connected at the base to the collector of the transistor TR5, at the collector to the emitters of the transistors TR1 and TR2, and grounded at emitters. The transistors TR5 and TR6 are so fabricated that the emitter area ratio of the transistor TR5 to transistor TR6 is 1:N. Accordingly, the collector currents I1 and I2 of the transistors TR3 and TR4 are related by an equation (1):

$$I2 = N \times I1 \quad (1)$$

The base-emitter voltage $V_{BE1}$ and $V_{BE2}$ of the transistors TR3 and TR4 have the following difference $\Delta V_{BE}$:

$$\Delta V_{BE} = V_{BE2} - V_{BE1} = \frac{kT}{q} \ln \frac{I2}{I1} = \frac{kT}{q} \ln N \quad (2)$$

where k is Boltzmann constant, q is the charge quantity of an electron and T is an absolute temperature.

The difference voltages $\Delta V_{BE}$ is also expressed as follows:

$$\Delta V_{BE} = R3 \times I1 \quad (3)$$

From the equations (2) and (3), the following equation is obtained:

$$I1 = \frac{1}{R3} \times \frac{kT}{q} \ln N \quad (4)$$

In the equation (4), $(k/q) \ln N$ is independent from temperature and hence it can be expressed as a constant P. From this, the equation (4) can be rewritten as follows:

$$I1 = \frac{PT}{R3} \tag{5}$$

In the equation (5), when I1 is partially differentiated with respect to T, the following equation is given:

$$\frac{\partial I1}{\partial T} = \frac{P \cdot R3 - PT\frac{\partial R3}{\partial T}}{R3^2} = \frac{P}{R3}(1 - \frac{\partial R3}{\partial T} \cdot \frac{T}{R3}) \tag{6}$$

The amplification factor GA of the amplifier section 1 is given $$GA = -gm \cdot R_L \tag{7}$$

where $R_L$ is a resistance of each of the resistors R1 and R2 and $$gm = \frac{q}{kT} \cdot \frac{I2}{2}$$

Therefore, the equation (7) can be rewritten as follows:

$$GA = \frac{-q}{2k} \cdot \frac{I2 \cdot R_L}{T} \tag{8}$$

By partially differentiating GA with respect to T, the following equation is obtained:

$$\frac{\partial GA}{\partial T} = \frac{-q}{2k} \cdot \frac{(\frac{\partial I2}{\partial T} \cdot R_L + I2 \cdot \frac{\partial R_L}{\partial T})T - I2 \cdot R_L}{T^2} \tag{9}$$

In order that the amplification factor GA is independent from temperature T, the condition $$\frac{\partial GA}{\partial T} = 0$$

must be satisfied. That is, $$(\frac{\partial I2}{\partial T} \cdot R_L + I2 \frac{\partial R_L}{\partial T})T - I2 \cdot R_L = 0 \tag{10}$$

The equation (10) can be rewritten as follows:

$$\frac{1}{I2} \cdot \frac{\partial I2}{\partial T} = \frac{1}{T} - \frac{1}{R_L} \cdot \frac{\partial R_L}{\partial T} \tag{11}$$

From the equation (1), the following equation is obtained:

$$\frac{\partial I2}{\partial T} = N \times \frac{\partial I1}{\partial T} \tag{12}$$

By substituting equation (12) into equation (6), the following equation is given:

$$\frac{\partial I2}{\partial T} = N \times \frac{P}{R3}(1 - T \cdot \frac{\partial R3}{\partial T} \cdot \frac{1}{R3}) \tag{13}$$

From equations (1), (5) and (13), the following equation is obtained:

$$\frac{1}{I2} \cdot \frac{\partial I2}{\partial T} = \frac{1}{T} - \frac{1}{R3} \cdot \frac{\partial R3}{\partial T} \tag{14}$$

If the equation (14) coincides with the equation (11), the amplification factor GA is not affected by temperature change. In other words, when the resistors are equalized in the temperature characteristic, that is, $$\frac{1}{R_L} \cdot \frac{\partial R_L}{\partial T} = \frac{1}{R3} \cdot \frac{\partial R3}{\partial T}$$

is satisfied, a good temperature compensation of the amplification factor GA can be attained in the amplifier section 1.

When substituting equations (1) and (4) for equation (8), the following equation is obtained:

$$GA = \frac{-q}{2k} \cdot N \cdot \ln N \cdot \frac{R_L}{R3} \tag{15}$$

As seen from equation (15), the amplification factor GA is determined by the area ratio of emitters of the transistors TR5 and TR6, and the resistance ratio of the resistor R3 and the resistor R1 or R2.

When circuit elements such as transistors and resistors are fabricated with relative conditional values such as predetermined area ratios and resistance ratios, an ordinary integrated circuit technology relatively easily realizes the fabrication, satisfying the conditions required. Therefore, the temperature-compensated amplifier circuit may be easily fabricated so that the amplification factor GA is little affected by temperature change.

Figure 2:
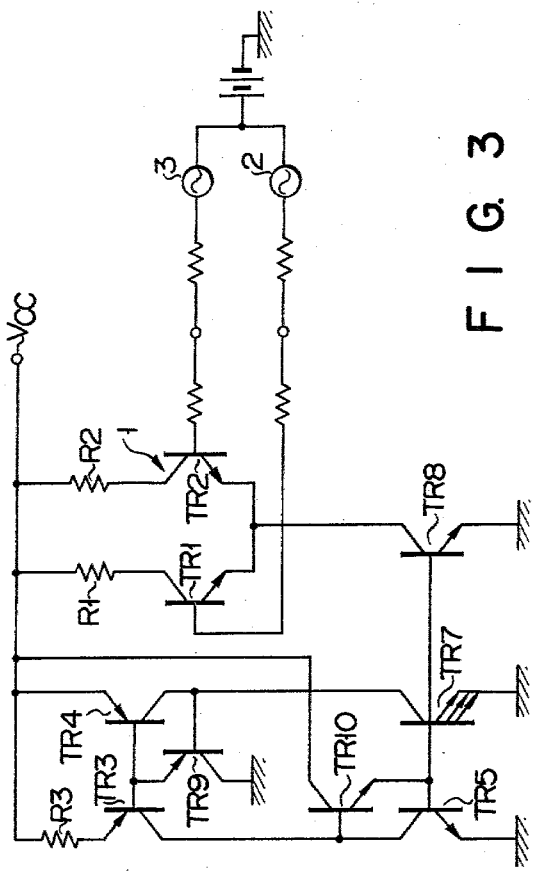
FIG. 2 shows a circuit diagram of a temperature-compensated amplifier circuit according to another embodiment of the invention.

Another embodiment of the temperature-compensated amplifier circuit of the invention is illustrated in FIG. 2. In FIG. 2, the same reference symbols are used to designate like circuit elements in FIG. 1, and the description thereof is omitted, for the purpose of simplification. In the amplifier circuit in FIG. 2, the collectors of transistors TR1 and TR2, these constituting an amplifier section, are connected through resistors R1 and R2 commonly to the power source terminal Vcc and not to the collector of the transistor TR4. The collector of the transistor TR4 is coupled with the collector of a transistor TR7 of multi-emitter type like a transistor TR6. The base of the transistor TR7 is connected to the base of a transistor TR5, and to the base of a transistor TR8 of which the collector is connected to the emitters of the transistors TR1 and TR2 and the emitter is grounded. The amplifier circuit further includes transistors TR9 and TR10. The collector of the transistor TR9 is grounded and the emitter and the base are respectively connected to the base and the collector of the transistor TR4. The transistor TR10 is connected at the base and emitter to the collector and the base of the transistor TR5, and at the collector to the power source terminal Vcc. The transistors TR9 and TR10 are used to compensate for error in the ratio of the currents I1 and I2 due to the base currents flowing into the bases of the transistors TR3, TR4, TR5, TR7 and TR8.

As in the amplifier in FIG. 1, the collector currents I1, I2 and I3 of the transistors TR3, TR4 and TR8 and the amplification factor GA of the amplifier section 1 in the FIG. 2 circuit are given $$I1 = \frac{1}{R3} \times \frac{kT}{q} \cdot \ln N \quad (16)$$

$$I2 = \frac{N}{R3} \times \frac{kT}{q} \cdot \ln N \quad (17)$$

$$GA = \frac{-q}{2k} \cdot \frac{I3 \cdot R_L}{T} = \frac{R_L}{2R3} \cdot N \cdot \ln N \quad (18)$$

where the ratio of emitter areas of the transistors TR5 and TR8 is 1/N and $$I3 = NI1 = \frac{N}{R3} \cdot \frac{kT}{q} \ln N.$$

Therefore, it is possible to keep the amplification factor GA constant with respect to temperature change, by equalizing the temperature characteristics of the resistors R1 to R3.

Figure 3:
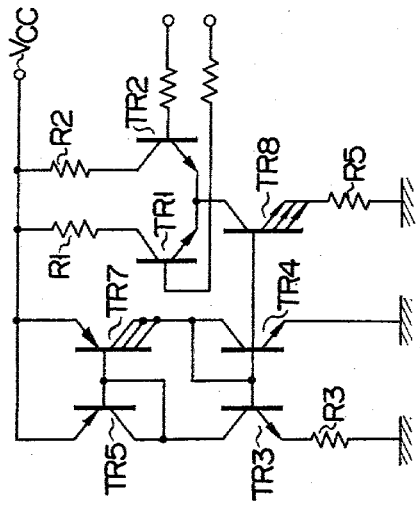
FIG. 3 shows a modification of the FIG. 2 circuit.

FIG. 3 shows a modification of the temperature-compensated amplifier circuit in FIG. 2. The amplifier circuit of FIG. 3 is substantially equal to that of FIG. 2, except that the resistor R3 and the emitter of the transistor TR4 are grounded, the base of the transistor TR8 is connected to the bases of the transistors TR3 and TR4 instead of the bases of the transistors TR5 and TR7, the emitter of the transistor TR8 is grounded through a resistor R5 and the emitters of the transistors TR5 and TR7 are connected to the power source terminal Vcc.

In this example, the transistor TR7 is of multi-collector type and has collectors as M times as the collector of the transistor TR5. Accordingly, the collector currents I1 and I2 of the transistors TR3 and TR4 are given $$I1 = \frac{V_{BE4} - V_{BE3}}{R3} = \frac{1}{R3} \cdot \frac{kT}{q} \cdot \ln M \quad (19)$$

$$I2 = \frac{M}{R3} \cdot \frac{kT}{q} \cdot \ln M \quad (20)$$

When both sides of the equation (20) are partially differentiated with respect to T, the following equation is obtained:

$$\frac{\partial I1}{\partial T} = \frac{R3 \cdot \frac{k}{q} \cdot \ln M - \frac{kT}{q} \cdot \frac{\partial R3}{\partial T}}{R3^2} \quad (21)$$

$$= \frac{k \cdot T \cdot \ln M}{q \cdot R3} \left( \frac{1}{T} - \frac{1}{R3} \cdot \frac{\partial R3}{\partial T} \right)$$

$$= I1 \left( \frac{1}{T} - \frac{1}{R3} \cdot \frac{\partial R3}{\partial T} \right)$$

Hence, the rate of variation in current I1 with respect to temperature change, $$\frac{1}{I1} \cdot \frac{\partial I1}{\partial T},$$

is given $$\frac{1}{I1} \cdot \frac{\partial I1}{\partial T} = \frac{1}{T} - \frac{1}{R3} \cdot \frac{\partial R3}{\partial T} \quad (22)$$

The ratio variation in current I1 with respect to temperature change, $$\frac{1}{I2} \cdot \frac{\partial I2}{\partial T},$$

is also equal to that of the current I2.

The emitter current I3 of the transistor TR8 is given by the following equation:

$$I3 = \frac{1}{R5} \cdot \frac{kT}{q} \cdot \ln \left( N \cdot \frac{I2}{I3} \right) \quad (23)$$

When both sides of the equation (23) is partially diferentiated with respect to T, the following equation is given:

$$\frac{\partial I3}{\partial T} = \frac{kT}{q} \cdot \frac{Co}{R5} \left\{ \frac{1}{T} - \frac{1}{R5} \cdot \frac{\partial R5}{\partial T} + \frac{1}{Co} \left( \frac{1}{I2} \cdot \frac{\partial I2}{\partial T} - \frac{1}{I3} \cdot \frac{\partial I3}{\partial T} \right) \right\} \quad (24)$$

$$= I3 \left\{ \frac{1}{T} - \frac{1}{R5} \cdot \frac{\partial R5}{\partial T} + \frac{1}{Co} \left( \frac{1}{I2} \cdot \frac{\partial I2}{\partial T} - \frac{1}{I3} \cdot \frac{\partial I3}{\partial T} \right) \right\}$$

where $$Co = \ln \left( N \cdot \frac{I1}{I3} \right).$$

The equation (24) is rewritten as follows:

$$\left( 1 + \frac{1}{Co} \right) \frac{1}{I3} \cdot \frac{\partial I3}{\partial T} = \frac{1}{T} - \frac{1}{R5} \cdot \frac{\partial R5}{\partial T} + \frac{1}{Co} \cdot \frac{1}{I2} \cdot \frac{\partial I2}{\partial T} \quad (25)$$

Since $\frac{1}{I2} \cdot \frac{\partial I2}{\partial T} = \frac{1}{T} - \frac{1}{R3} \cdot \frac{\partial R3}{\partial T}$, $$\left( 1 + \frac{1}{Co} \right) \frac{1}{I3} \cdot \frac{\partial I3}{\partial T} = \frac{1}{T} - \frac{1}{R5} \cdot \frac{\partial R5}{\partial T} + \frac{1}{Co} \left( \frac{1}{T} - \frac{1}{R3} \cdot \frac{\partial R3}{\partial T} \right) \quad (26)$$

For obtaining an effective temperature compensation in the amplifier section 1, $$\frac{1}{I3} \cdot \frac{\partial I3}{\partial T}$$

should be made equal to $$\left( \frac{1}{T} - \frac{1}{R3} \cdot \frac{\partial R3}{\partial T} \right),$$

and therefore the following conditional equation is obtained from equation (26):

$$\frac{1}{R3} \cdot \frac{\partial R3}{\partial T} = \frac{1}{R5} \cdot \frac{\partial R5}{\partial T} \quad (27)$$

From the equation (27), it is clearly understood that, when the temperature coefficient of the resistor R5 is equal to that of the resistor R3, the amplifier section 1 is well temperature-compensated.

Figure 4:
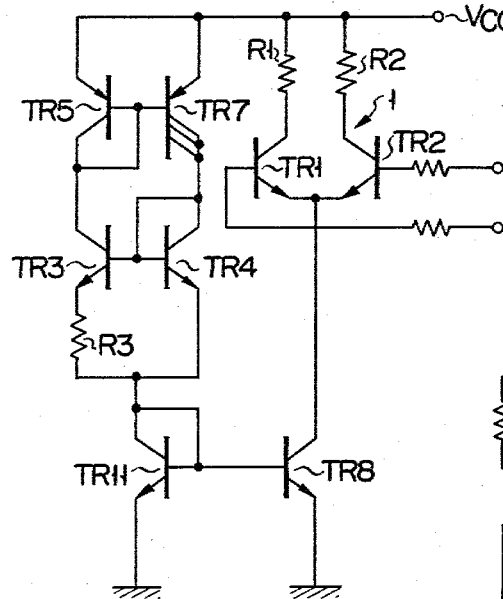
FIG. 4 shows a modicication of the FIG. 3 circuit, enabling a larger current to flow into an amplifier section.

A modification of the FIG. 3 example is illustrated in FIG. 4. In the circuit shown in FIG. 4, the emitters of transistors TR3 and TR4 are connected to each other, through a resistor R3. A transistor TR11 is connected at the collector to the junction between the emitter of the transistor TR4 and the resistor R3, at the emitter to the ground, and at the base to the collector of the transistor TR11 per se and to the base of the transistor TR8. The FIG. 4 circuit is advantageous in that sufficiently effective temperature compensation is obtained and that a larger drive current is permitted to flow through the amplifier section 1. Possible is the insertion of a resistor having the same temperature coefficient as resistors R3, R1 and R2 between the emitter of the transistor TR11 and ground.

Figure 5:
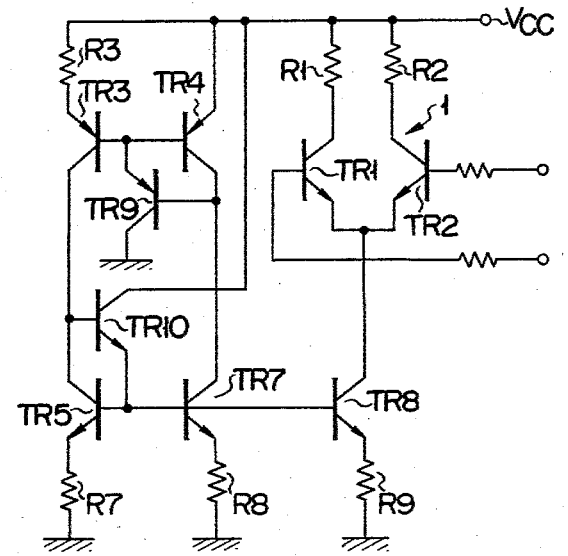
FIG. 5 shows a circuit diagram of modification of the temperature-compensated amplifier circuit shown in FIG. 2.

A modification of the FIG. 2 amplifier circuit is shown in FIG. 5. In this circuit, transistors TR5, TR7 and TR8 are similarly connected to each other. The resistance ratio among resistors R7 to R9 respectively connected between the emitters of these transistors and ground, determines the current ratio of the currents flowing through the collector-emitter paths of the transistors TR5, TR7 and TR8. In this case, it is required that the resistors R7 to R9 be so selected that they have substantially the same temperature coefficient and the voltage drops across the resistors R7 to R9 are set larger than the base-emitter voltages $V_{BE}$ of the transistors TR5, TR7 and TR8. This makes it possible to neglect the difference between the base-emitter voltages of the transistors TR5, TR7 and TR8 due to currents respectively flowing through the transistors TR5, TR7 and TR8. Accordingly, the ratio of currents flowing through the transistors TR5, TR7 and TR8 is determined by the ratio of the resistances of the resistors R7, R8 and R9.

Figure 6:
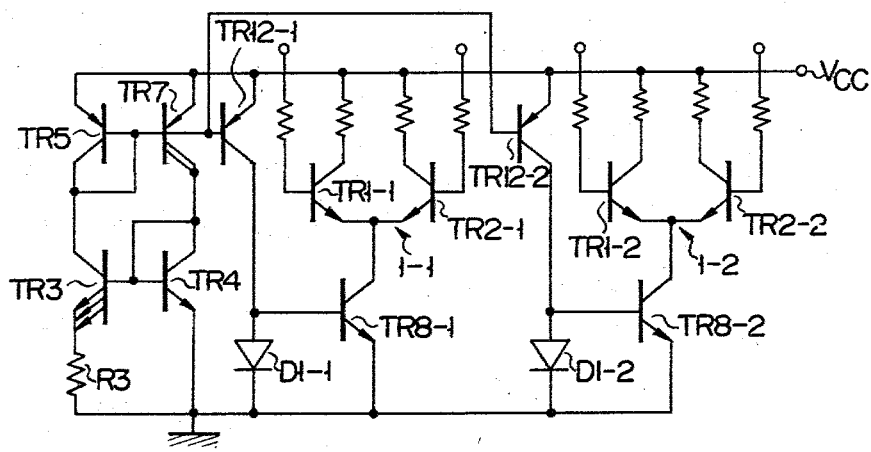
FIG. 6 shows a circuit diagram of a temperature-compensated amplifier circuit with a plurality of amplifier sections.

FIG. 6 shows a modification of the FIG. 3 circuit, in which a plurality of amplifier sections 1 are indivisually driven. In the amplifier circuit in FIG. 6, a current corresponding to that flowing through a resistor R3 flows through a current path including a transistor TR12 and a diode D1. The junction between the diode D1 and the transistor TR12 is connected to the base of a transistor TR8. Current flowing through the diode D1, i.e. the current corresponding to current flowing through the resistor R3, flows through the current path of the transistor TR8. In this way, the current path of a combination of the transistor TR12 and the diode D1 is provided in each amplifier circuit section 1. Accordingly, the amplifier sections 1-1 and 1-2 are driven by individual control signals, respectively. In this point, this example is advantageous.

Still another embodiment of the invention is shown in FIG. 7. This example is substantially equal to the FIG. 2 example, except that the amplifier section 1 includes a transistor TR13 connected at the base to the junction between the collectors of the transistors TR5 and TR3, at the collector to the power source terminal Vcc via a resistor R11, and at the emitter to ground. Making the temperature coefficient of the resistor R11 coincide with that of a resistor R3, enables the amplification factor of the transistor TR13 to be kept substantially constant with respect to temperature change.

FIG. 8 shows a still another embodiment of this invention in which a plurality of amplifier sections 1-1 and 1-2 are connected in cascade fashion. The ratio of the current flowing through the current path of a transistor TR6 to that flowing through the current path of the transistor TR3, is determined by the resistances of resistors R13 and R14. The resistor R12 functions like the resistor R3 in the FIG. 1 circuit.

A temperature-compensated amplifier circuit according to further embodiment of the invention is illustrated in FIG. 9. The temperature compensation circuit includes a transistor TR15 connected at the collector to the emitters of transistors TR1 and TR2, these constituting an amplifier section 1, and a series circuit including a resistor R16 and diodes D2-1 to D2-n. The anode of the diode D2-1 is connected to the base of the transistor TR15.

In the FIG. 9 circuit, the amplification factor GA of the amplifier section 1 is given by the following equation:

$$GA = \frac{-q}{k} \cdot \frac{Ie \cdot R_L}{T} \quad (28)$$

where Ie is current flowing through the collector-emitter path of the transistor TR1 or TR2.

By partially differentiating both sides of the equation (28) with respect to T, the following equation is obtained:

$$\frac{\partial GA}{\partial T} = \frac{-q}{k} \cdot \frac{(\frac{\partial Ie}{\partial T} \cdot R_L + Ie \cdot \frac{\partial R_L}{\partial T})T - Ie \cdot R_L}{T^2} \quad (29)$$

Now suppose that $$\frac{\partial GA}{\partial T} = 0$$

in the equation (29) and the equation (29) can be rewritten as follows:

$$\frac{1}{Ie} \cdot \frac{\partial Ie}{\partial T} = \frac{1}{T} - \frac{1}{R_L} \cdot \frac{\partial R_L}{\partial T} \quad (30)$$

Satisfying the equation (30) may restrict the variation of the amplification factor of the amplifier section 1 in FIG. 9 due to temperature change, to a great extent.

Current $I_D$ flowing through the path including resistor R16 and diodes D2-1 to D2-n is related with the current 2Ie flowing through the collector-emitter path of the transistor TR15, as given below.

$$Ie = m I_D \quad (31)$$

Hence, $$\frac{1}{Ie} \cdot \frac{\partial Ie}{\partial T} = \frac{1}{I_D} \cdot \frac{\partial I_D}{\partial T} \quad (32)$$

Accordingly, from the equations (30) and (32), the following equation is obtained:

$$\frac{1}{I_D} \cdot \frac{\partial I_D}{\partial T} = \frac{1}{T} - \frac{1}{R_L} \cdot \frac{\partial R_L}{\partial T} \quad (33)$$

This provides a sufficiently effective temperature compensation effect in the circuit in FIG. 9.

The current $I_D$ flowing through the diodes D2-1 to D2-n is given $$I_D = \frac{V_{CI} - nV_{FD}}{R16} \quad (34)$$

where $V_{FD}$ is a forward voltage drop of each diode D2-1 to $$D2-n \cdot \frac{1}{I_D} \cdot \frac{\partial I_D}{\partial T}$$

is derived out from equation (34)

$$\frac{1}{I_D} \cdot \frac{\partial I_D}{\partial T} = \frac{\frac{\partial V_{CI}}{\partial T} - n \frac{\partial V_{FD}}{\partial T}}{V_{CI} - nV_{FD}} - \frac{1}{R16} \cdot \frac{\partial R16}{\partial T} \quad (35)$$

Since the temperature characteristics of the resistors R1 and R2, and resistor R16 are equal, the following equation is given:

$$\frac{1}{R16} \cdot \frac{\partial R16}{T} = \frac{1}{R_L} \cdot \frac{\partial R_L}{T} \quad (36)$$

Substituting equations (33) and (36) into equation (34), n can be derived from the equation (34) as follows:

$$n = \frac{V_{CI} - \frac{\partial V_{CI}}{\partial T} \cdot T}{V_{FD} - \frac{\partial V_{FD}}{\partial T} \cdot T} \quad (37)$$

From the equation (37), it is clearly understood that, if the operation voltage $V_{CI}$ and the operation temperature T are given, the number n of diodes to be efficiently used can be calculated. Accordingly, when thus calculated number n of diodes are used, the variation of the amplification factor by temperature change in the circuit under discussion, can be minimized.

Figure 10:
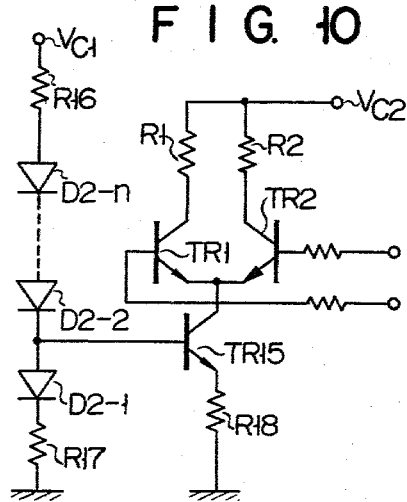
FIG. 10 shows a circuit diagram of a temperature-compensated amplifier circuit according to still another embodiment of this invention in which the ratio of currents flowing into the diode series and the amplifier section is determined by resistance ratio.

FIG. 10 shows an even further embodiment of the invention. In this embodiment, the ratio of the current flowing through a series circuit including a resistor R16 and a series of diodes D2-1 to D2-n to the current flowing through the current path of a transistor TR15, is determined by a resistor R17 connected between the cathode of the diode D2-1 and ground and another resistor R18 between the emitter of the transistor TR15 and ground. Resistors having the same temperature coefficient are used for the resistors R17 and R18 and the resistances thereof are so selected as to be larger than the forward voltage drop across the diode D2-1 and the base-emitter voltage of the transistor TR15. The temperature-compensated amplifier circuit shown in FIG. 10 can attain the temperature compensating effect similar to that of FIG. 9 circuit.

Figure 11:
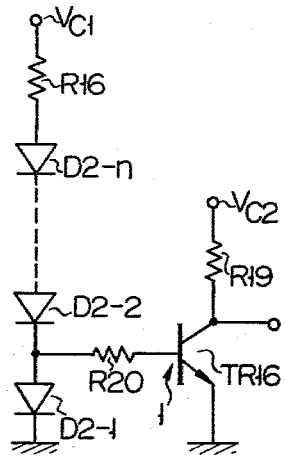
FIG. 11 shows a circuit diagram of a temperature-compensated amplifier circuit in which a part of the current source is formed by a diode circuit and the amplifier section is formed by a single transistor.

FIG. 11 shows another embodiment of the temperature-compensated amplifier circuit according to the invention. In the circuit, the amplifier section 1 includes a transistor TR16 which is connected at the collector to the power source terminal $V_{C2}$ via a load resistor R19, at the emitter to ground and at the base to the anode of the diode D2-1 via a resistor R20. In this circuit, too, the temperature coefficients of resistors R16, R19 and R20 are selected to be equal. The temperature compensating effect resulting from this example is similar to that of the FIG. 9 example.

Figure 12:
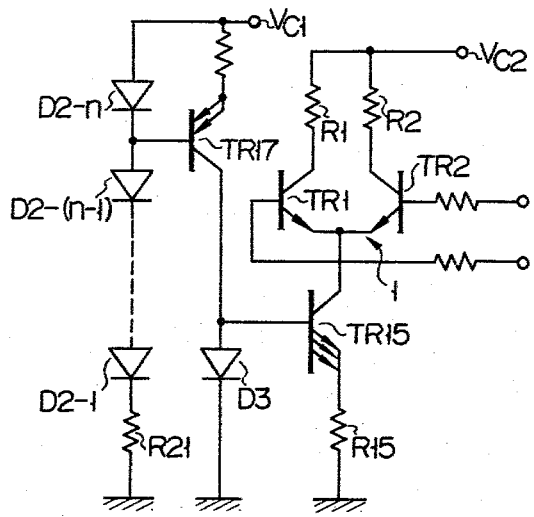
FIG. 12 is a modification of the FIG. 9 circuit.

FIG. 12 shows a modification of the temperature-compensated amplifier circuit shown in FIG. 9. The FIG. 12 circuit is substantially equal to the FIG. 9 one, except that the resistor R16 is eliminated, a resistor R21 is connected between the cathode of the diode D2-1 and ground, and a multi-emitter type transistor TR17 is used which is connected at the base to the cathode of the diode D2-n, at the emitter to the power source terminal $V_{CI}$ and at the collector to ground by way of a diode D3. The base of the transistor TR15 is connected to the anode of the diode D3.

While the invention has been described relating to some examples, it is not limited to them alone. For example, in the embodiment using a differential amplifier for the amplifier section 1 such as a FIG. 1 circuit, the resistor R2 and the transistor TR2 may be omitted and the amplifier section may be constructed by a single transistor.

In the embodiment shown in FIG. 1, for example, the transistor TR6 is formed as a multi-emitter transistor to conduct a current having a predetermined rate with respect to a current flowing through the transistor TR5. However, it is possible to form the transistor TR6 by an ordinary transistor whose emitter area is predetermined times larger than that of the transistor TR5.

Figure 13:
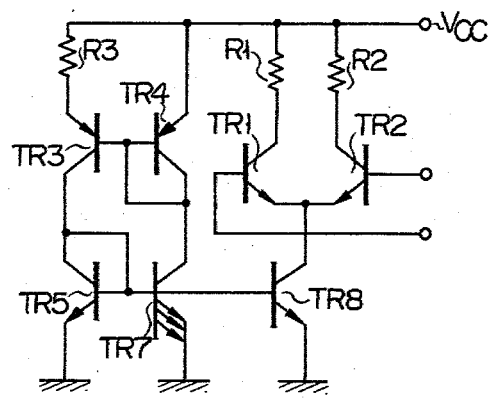
FIG. 13 is a modification of the FIG. 2 circuit.

Further, in the embodiment shown in FIG. 2, the transistors TR9 and TR10 are used, but the transistors TR9 and TR10 can be omitted and the collector and base of each of the transistors TR4 and TR5 can be directly connected as shown in FIG. 13.

What is claimed is:

1. A temperature-compensated amplifier circuit comprising:
    a first power source terminal;
    a reference power source terminal;
    an amplifier section;
    resistive load means connected between said amplifier section and the first power source terminal;
    temperature compensating resistive means having substantially the same temperature characteristic as said resistive load means; and
    current source means having a first current path connected to said temperature compensating resistive means and a second current path connected between said amplifier section and the reference power source terminal, causing a first current to flow through said temperature compensating resistive means and a drive current having a given ratio to the first current to flow through said amplifier section, said first current path including a PN junction device, a first transistor whose emitter-collector path is coupled between one terminal of said temperature compensating resistive means and one terminal of said PN junction device, a second transistor whose emitter is coupled to the other terminal of said temperature compensating resistive means and whose base and collector are coupled to the base of said first transistor, and a third transistor whose collector is coupled to the collector of said second transistor, whose emitter is coupled to the other terminal of said PN junction device and whose base is coupled to said one terminal of said PN junction device, and said second current path including a fourth transistor whose collector-emitter path is coupled between said amplifier section and the reference power source terminal.

2. A temperature-compensated amplifier circuit according to claim 1, wherein said PN junction device is a fifth transistor whose base and collector are coupled to the collector of said first transistor and whose emitter is coupled to the emitter of said third transistor.

3. A temperature-compensated amplifier circuit according to claim 1 or 2, wherein said fourth transistor has a based coupled to one terminal of said PN junction device.

4. A temperature-compensated amplifier circuit according to claim 1 or 2, wherein said fourth transistor has a base coupled to the base of said second transistor.

5. A temperature-compensated amplifier circuit according to claim 1 or 2, said first current path further comprising an additional PN junction device coupled between the other terminal of said temperature compensating resistive means and said reference power source terminal, and said fourth transistor having a base coupled to the junction between said temperature compensating resistive means and said additional PN junction device.

6. A temperature-compensated amplifier circuit according to claim 5, wherein said additional PN junction device is a transistor whose base and collector are coupled to the other terminal of said temperature compensating resistive means and whose emitter is coupled to the reference power source terminal.

7. A temperature-compensated amplifier circuit according to claim 1 or 2, wherein said second current path further includes an additional PN junction device and an additional transistor whose base and emitter are respectively coupled to the base and emitter of said third transistor anod whose collector is coupled to said reference power source terminal through said additional PN junction device and said fourth transistor has a base coupled to the junction between the collector of said additional transistor said PN junction between the collector of said additional transistor said PN junction device.

8. A temperature-compensated amplifier circuit according to claim 1 or 2, wherein the base and collector of the fourth transistor of said current source are connected to each other via the emitter-base path of a sixth transistor of which the collector is coupled with the reference power source terminal.

9. A temperature-compensated amplifier circuit according to claim 1 or 2, wherein said current source comprises first, second and third resistive means which are respectively connected between said reference power source terminal and said PN junction device and the emitters of said third and fourth transistors and of which the temperature characteristics are each equal to that of said temperature compensating resistive means, and the resistance ratios of said first to third resistors also determine the ratios of the currents respectively flowing through the PN junction device and the collector-emitter paths of said third and fourth transistors.

10. A temperature-compensated amplifier circuit according to claim 1 or 2, wherein said load resistive means includes first and second resistors, and said amplifier section includes sixth and seventh transistors which are respectively connected at the collectors to said first power source terminal via said first and second resistors and at the emitters to the reference power source terminal by way of the collector-emitter path of said first transistor.

11. A temperature-compensated amplifier circuit comprising:
a first power source terminal;
a reference power source terminal;
an amplifier section;
resistive load means connected between said amplifier section and the first power source terminal;
temperature compensating resistive means having substantially the same temperature characteristic as said resistive load means; and
current source means including a PN junction device, first and second resistors connected to each other at one terminal, a first transistor whose emitter is connected to the other terminal of said first resistor and whose collector is coupled to the reference power source terminal through said PN junction device, a second transistor whose emitter is coupled to the other terminal of said second resistor and whose base and collector are coupled to the base of said first transistor and at the same time to said amplifier section through said resistive load means, and a third transistor whose emitter is coupled to the reference power source terminal through said temperature compensating resistive means, whose collector is coupled to said amplifier section and whose base is coupled to the junction between the collector of said first transistor and said PN junction device.

12. A temperature-compensated amplifier circuit according to claim 11, wherein said resistive load means includes third and fourth resistors coupled at one terminal to the collector of said second transistor and wherein said amplifier section includes fifth and sixth transistors whose collectors are respectively coupled to the other terminals of said third and fourth resistors and whose emitters are commonly coupled to the collector of said third transistor.

13. A temperature-compensated amplifier circuit according to claim 11 or 12, wherein said PN junction device is a transistor whose base and collector are coupled to the collector of said first transistor and to the base of said third transistor and whose emitter is connected to the reference power source terminal.

14. A temperature-compensated amplifier circuit comprising:
a first power source terminal;
a reference power source terminal;
an amplifier section having input and output terminals;
resistive load means coupled between said first power source terminal and the output terminal of said amplifier section;
temperature compensating resistive means having substantially the same temperature characteristic as said resistive load means; and
current source means including a first transistor whose emitter is coupled to the first power source terminal through said temperature compensating resistive means, a second transistor whose emitter is coupled to the first power source terminal and whose base and collector are commonly connected to the base of said first transistor, a third transistor whose collector-emitter path is coupled between the collector of said second transistor and the reference power source terminal, and a fourth transistor whose collector-emitter path is coupled between the collector of said first transistor and the reference power source terminal and whose base and collector are coupled to the input terminal of said amplifier section through a resistor.

15. A temperature-compensated amplifier circuit according to claim 14, wherein said amplifier section is a transistor whose collector-emitter path is coupled between said resistive load means and the reference power source terminal and whose base is coupled to the collector of said fourth transistor through said resistor.

16. A temperature-compensated amplifier circuit comprising:
a first power source terminal;
a reference power source terminal;
an amplifier section;
resistive load means coupled between said amplifier section and the first power source terminal;

temperature compensating resistive means having substantially the same temperature characteristic as said resistive load means; and current source means having a first current path coupled to said temperature compensating resistive means and a second current path connected between said amplifier section and the reference power source terminal, causing a first current to flow through said temperature compensating resistive means and a drive current having a given ratio to the first current, said first current path including a PN junction device, a first transistor whose emitter-collector path is coupled between one terminal of said temperature compensating resistive means and one terminal of said PN junction device and a second transistor whose emitter is coupled to the other terminal of said temperature compensating resistive means and whose base and collector are coupled to the base of said first transistor and at the same time to said amplifier section through said resistive load means, and said second current path including a third transistor whose collector-emitter path is coupled between said amplifier section and the reference power source terminal and whose base is coupled to said one terminal of said PN junction device.

17. A temperature-compensated amplifier circuit to claim 16, wherein said PN junction devices is a transistor whose base and collector are coupled to the collector of said first transistor and whose emitter is connected to the reference power source terminal.

18. A temperature-compensated amplifier circuit according to claim 17, wherein said load resistive means includes first and second resistors, and said amplifier section includes fourth and fifth transistors connected between said first power source terminal and the collector of said third transistor, through said first and second resistors.

19. A temperature-compensated amplifier circuit comprising:
a first power souce terminal;
a reference power source terminal;
an amplifier section;
resistive load means connected between said amplifier section and the first power source terminal;
temperature compensating resitive means having substantially the same temperature characteristic as said resistive load means; and
current source means having a first current path connected to said temperature compensating resistive means and a second current path coupled between said amplifier section and the reference power source terminal, causing a first current to flow through said temperature compensating resistive means and a drive current having a given ratio to the first current to flow through said amplifier section, said first current path including a series circuit of a plurality of PN junction devices coupled between the first and reference power source terminals through said temperature compensating resistive means and said second current path including a first transistor whose collector-emitter path is coupled between said amplifier section and the reference power source terminal and whose base is coupled to the junction between adjacent two of said plurality of PN junction devices.

20. A temperature-compensated amplifier circuit according to claim 19, wherein said first transistor is connected at the base to one terminal of that one of said plurality of PN junction devices whose other terminal is connected to said reference power source terminal.

21. A temperature-compensated amplifier circuit according to claim 19, wherein said temperature compensating resistive means is connected between said series circuit of PN junction devices and said first power source terminal, and said current source includes a first resistor coupled between said series circuit and said reference power source terminal and a second resistor connected between the emitter of said first transistor and said reference power source terminal.

22. A temperature-compensated amplifier circuit according to claim 19, wherein said amplifier section comprises second and third transistors having collector-emitter paths coupled between said first power source terminal and the collector of said first transistor, through said load resistive means.

23. A temperature-compensated amplifier circuit according to claim 19, wherein said temperature compensating resistive means is coupled between said series circuit and said reference power source terminal, and said current source includes a second transistor having a base connected to one terminal of that one of said PN junction devices whose other terminal is connected to said first power source terminal, and a single PN junction device coupled between the collector of said second transistor and said reference power source terminal, the base of said first transistor being connected to the junction between the collector of said second transistor and said single PN junction device.

24. A temperature-compensated amplifier circuit comprising:
first and second power source terminals;
resistive load means;
temperature compensating resistive means having substantially the same temperature characteristic as said resistive load means;
a series circuit of a plurality of PN junction devices coupled between the first and second power source terminals through said temperature compensating resistive means; and
an amplifier section having an input terminal coupled to the junction between adjacent two of said plurality of PN junction devices through a resistor and an output terminal connected to a third power source terminal through said resistive load means.

25. A temperature-compensated amplifier circuit according to claim 24, wherein said amplifier section is a transistor having a base coupled to the junction between adjacent two or said plurality of PN junction devices through said resistor and a collector-emitter path coupled between the first and second power source terminals through said resistive load means.

* * * * *